United States Patent
Okochi et al.

(10) Patent No.: US 10,327,369 B2
(45) Date of Patent: Jun. 18, 2019

(54) AUTOMATIC ASSEMBLING SYSTEM FOR IMPROVING YIELD OF AUTOMATIC ASSEMBLY OF PRINTED CIRCUIT BOARD, AND AUTOMATIC ASSEMBLING METHOD

(71) Applicant: FANUC CORPORATION, Yamanashi (JP)

(72) Inventors: Yuichi Okochi, Yamanashi (JP); Norihiro Saido, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 157 days.

(21) Appl. No.: 15/489,145

(22) Filed: Apr. 17, 2017

(65) Prior Publication Data

US 2017/0303450 A1    Oct. 19, 2017

(30) Foreign Application Priority Data

Apr. 18, 2016    (JP) ................. 2016-083140

(51) Int. Cl.
*B23K 1/00*    (2006.01)
*B23K 3/00*    (2006.01)
(Continued)

(52) U.S. Cl.
CPC ....... *H05K 13/0465* (2013.01); *B23K 1/0016* (2013.01); *H05K 13/0015* (2013.01);
(Continued)

(58) Field of Classification Search
CPC ......... H01L 2223/5444; H01L 2924/00; H01L 22/20; H01L 23/544; B23K 1/00; B23K 1/0016; B23K 2101/42; B23K 3/08
See application file for complete search history.

(56) References Cited

U.S. PATENT DOCUMENTS

| 5,321,885 A | 6/1994 | Hino et al. |
| 6,405,430 B1 * | 6/2002 | Weyerman ......... H05K 13/0092 |
| | | 29/564.6 |

(Continued)

FOREIGN PATENT DOCUMENTS

| CN | 201773977 U | 3/2011 |
| CN | 103582311 A | 2/2014 |

(Continued)

OTHER PUBLICATIONS

Notification of Reasons for Refusal for Japanese Application No. 2016-083140, dated Apr. 3, 2018, including English translation, 7 pages.

Primary Examiner — Erin B Saad
(74) Attorney, Agent, or Firm — RatnerPrestia

(57) ABSTRACT

In the automatic assembling system, a part mounting cell includes a solder mounting unit that solders an electronic part to a printed circuit board, and a printed-circuit-board information acquisition unit that acquires printed circuit board information including at least one of position information on an alignment mark disposed at a specific position on the printed circuit board, mounting position information on the electronic part on the printed circuit board, and warpage information on the printed circuit board. The manufacturing management device includes a compensation data generation unit that generates, based on the printed circuit board information, compensation data for compensating for a program to be executed in a downstream process cell. The downstream process cell includes a downstream process execution unit that executes a downstream process based on the compensation data generated by the compensation data generation unit.

9 Claims, 5 Drawing Sheets

(51) Int. Cl.
  *H05K 13/04* (2006.01)
  *H05K 13/00* (2006.01)
  *H05K 13/08* (2006.01)
  *B23K 101/42* (2006.01)

(52) U.S. Cl.
  CPC ........... *H05K 13/08* (2013.01); *H05K 13/083* (2018.08); *B23K 2101/42* (2018.08)

(56) References Cited

U.S. PATENT DOCUMENTS

| 6,572,702 | B1* | 6/2003 | Freeman | B23P 21/004 |
| | | | | 118/313 |
| 6,858,806 | B2* | 2/2005 | Canova | H05K 1/0263 |
| | | | | 174/250 |
| 6,917,848 | B1* | 7/2005 | Nakayama | G05B 19/41865 |
| | | | | 700/103 |
| 8,636,546 | B2 | 1/2014 | He et al. | |
| 9,449,756 | B2 | 9/2016 | Calvin et al. | |

FOREIGN PATENT DOCUMENTS

| CN | 104134512 A | 11/2014 |
| CN | 105345194 A | 2/2016 |
| JP | H04-017400 A | 1/1992 |
| JP | H07-013609 A | 1/1995 |
| JP | H07321492 A | 12/1995 |
| JP | 10-263957 | 10/1998 |
| JP | H11347859 A | 12/1999 |
| JP | 2002305397 A | 10/2002 |
| JP | 2003008299 A | 1/2003 |
| JP | 2014135482 A | 7/2014 |
| JP | 2014179186 A | 9/2014 |
| JP | 2015008185 A | 1/2015 |
| WO | 1992017047 A1 | 10/1992 |

* cited by examiner

AUTOMATIC ASSEMBLING SYSTEM FOR IMPROVING YIELD OF AUTOMATIC ASSEMBLY OF PRINTED CIRCUIT BOARD, AND AUTOMATIC ASSEMBLING METHOD

BACKGROUND OF THE INVENTION

1. Field of the Invention

The present invention relates to an automatic assembling system for improving the yield of automatic assembly of a printed circuit board, and an automatic assembling method.

2. Description of the Related Art

A mounting process for mounting electronic parts such as capacitors, resistors, and connectors on a printed circuit board includes a reflow soldering process (solder paste printing, part arrangement, and reflow furnace heating) or a flow soldering process (part arrangement and soldering using a flow solder bath and so on). If these mounting processes are followed by a process of joining printed circuit boards or a process of joining a printed circuit board and other parts, the printed circuit boards and the parts are generally joined via connector parts mounted on the printed circuit boards. In this case, the mounting positions of connectors may be displaced and prevent joining of the connectors during device assembly or an excessive load may be applied to the printed circuit boards during the joining of the connectors, thereby damaging the connectors and other mounted parts.

In downstream processes, the bar codes or alignment marks of the printed circuit boards used may be read to obtain specific information on the printed circuit boards. The printed circuit boards may have warpage or expansion/contraction errors because of the thermal hysteresis of soldering during the mounting of parts. This may displace the positions of the bar codes or alignment marks of the printed circuit boards, preventing reading by image recognition. Therefore, methods for improving the yields of automatic assembling systems are disclosed in the following patent literatures:

Japanese Patent No. 2828870 discloses a technique of adjusting the characteristics of parts used for a subsequent assembly, based on the characteristic inspection result of an assembly of multiple parts.

Japanese Patent No. 2935532 discloses a technique of transferring information on a printed circuit board from an upstream process to a downstream process so as to increase task efficiency when parts are mounted on the printed circuit board.

Japanese Patent No. 3705672 discloses a technique of providing offline programming of automatic assembling devices from design information.

SUMMARY OF THE INVENTION

In addition to the joining of printed circuit boards or the joining of a printed circuit board and other parts, the mounting process of soldering electronic parts to a printed circuit board in a part mounting cell is followed by a process of applying a coating material to a printed circuit board to obtain corrosion resistance or insulation reliability or a process of applying an adhesive to physically join other parts to a printed circuit board. Furthermore, in order to improve manufacturing efficiency for mounting parts, if printed circuit boards to be final products are grouped and parts are mounted on the grouped printed circuit boards, a process of dividing the printed circuit boards may be used. Moreover, a process of moving a printed circuit board between these processes is available. If manufacturing is automated using a downstream process cell in the downstream processes, the state of a printed circuit board may be changed by the thermal hysteresis of the printed circuit board in a part mounting cell. This may displace a position indicated by a program of the downstream process cell from an actual position of the printed circuit board or an actual position of a part, requiring a correction of the program for each displacement.

Unfortunately, an amount of warpage or an amount of expansion/contraction of a printed circuit board after a thermal hysteresis is not continuously monitored to be fed back to the manufacturing conditions of the part mounting cell or the downstream process cell, or data on the amount is not collected to be fed back to the manufacturing conditions and the artwork design of the printed circuit board.

This requires a technique of improving the yield of a downstream process cell even when the state of a printed circuit board is changed by the thermal hysteresis and so on of the printed circuit board.

A first aspect of the present invention provides an automatic assembling system including at least one part mounting cell in charge of a mounting process of soldering an electronic part to a printed circuit board, at least one downstream process cell in charge of a downstream process including a manufacturing process following the mounting process, and at least one manufacturing management device that receives data from the part mounting cell, transmits the data to the downstream process cell, and manages manufacturing, wherein the part mounting cell includes a solder mounting unit that solders the electronic part to the printed circuit board, a printed-circuit-board information acquisition unit that acquires printed circuit board information including at least one of position information on an alignment mark disposed at a specific position on the printed circuit board so as to facilitate position arrangement of the printed circuit board, mounting position information on the electronic part on the printed circuit board, and warpage information on the printed circuit board, and a data transmission unit that transmits the printed circuit board information to the manufacturing management device, the manufacturing management device includes a data reception unit that receives the printed circuit board information from the part mounting cell, a compensation data generation unit that compensates for, based on the printed circuit board information, a program to be executed in the downstream process cell, and a data transmission unit that transmits the compensation data to the downstream process cell, and the downstream process cell includes a data reception unit that receives the compensation data from the manufacturing management device and a downstream process execution unit that executes the downstream process based on the compensation data generated by the compensation data generation unit.

A second aspect of the present invention provides, in the first aspect, an automatic assembling system wherein the part mounting cell further includes a production management information acquisition unit that acquires production management information allowing identification of the printed circuit board and transmits the acquired production management information with the printed circuit board information to the manufacturing management device, the downstream process cell further includes a production management information acquisition unit that acquires production management information allowing identification of the printed circuit board, and a data transmission unit that transmits the production management information to the manufacturing management device, and the manufacturing management device confirms that printed circuit boards to be targeted in the part mounting cell and the downstream process cell are identical to each other based on the production management information received from the part mounting cell and the downstream process cell, and transmits the compensation data generated by the compensation data generation unit to the downstream process cell.

A third aspect of the present invention provides, in the first or second aspect, an automatic assembling system further including a host computer including a data reception unit that receives data from the manufacturing management device, the manufacturing management device further including a data transmission unit that transmits data to the host computer.

A fourth aspect of the present invention provides, in the third aspect, an automatic assembling system wherein the manufacturing management device further includes a printed-circuit-board state monitoring unit that monitors the printed circuit board information, and if the printed circuit board information deviates from a specified value, the printed-circuit-board state monitoring unit transmits the printed circuit board information deviating from the specified value to the host computer.

A fifth aspect of the present invention provides, in the third or fourth aspect, an automatic assembling system wherein the part mounting cell further includes a facility information acquisition unit that acquires facility information including the manufacturing conditions of a device constituting the solder mounting unit, and the acquired facility information is transmitted with the printed circuit board information to the host computer through the manufacturing management device.

A sixth aspect of the present invention provides, in the fifth aspect, an automatic assembling system wherein the downstream process cell further includes a facility information acquisition unit that acquires facility information including the manufacturing conditions of a device constituting the downstream process execution unit, the manufacturing management device further includes a cell state monitoring unit that monitors the facility states of the part mounting cell and the downstream process cell, and if the printed circuit board information deviates from a specified value, the cell state monitoring unit transmits the facility information acquired in the part mounting cell and the downstream process cell to the host computer along with the printed circuit board information deviating from the specified value.

A seventh aspect of the present invention provides, in the sixth aspect, an automatic assembling system wherein the downstream process cell further includes a downstream-process result acquisition unit that acquires a downstream process result including position information on other parts joined to the printed circuit board, and the acquired downstream process result is transmitted to the host computer through the manufacturing management device.

An eighth aspect of the present invention provides, in the seventh aspect, an automatic assembling system wherein the compensation data generation unit generates compensation data based on the downstream process result in addition to the printed circuit board information.

A ninth aspect of the present invention provides an automatic assembling method performed by an automatic assembling system including at least one part mounting cell in charge of a mounting process of soldering an electronic part to a printed circuit board, at least one downstream process cell in charge of a downstream process including a manufacturing process following the mounting process, and at least one manufacturing management device that receives data from the part mounting cell, transmits the data to the downstream process cell, and manages manufacturing, the method including the steps of: soldering the electronic part to the printed circuit board in the part mounting cell; acquiring printed circuit board information including at least one of position information on an alignment mark disposed at a specific position on the printed circuit board so as to facilitate position arrangement of the printed circuit board, mounting position information on the electronic part on the printed circuit board, and warpage information on the printed circuit board; transmitting the acquired printed circuit board information to the manufacturing management device; generating compensation data for compensating for a program to be executed in the downstream process cell, based on the printed circuit board information received by the manufacturing management device; transmitting the generated compensation data to the downstream process cell; and executing the downstream process according to the compensation data received by the downstream process cell.

DETAILED DESCRIPTION

Figure 1:
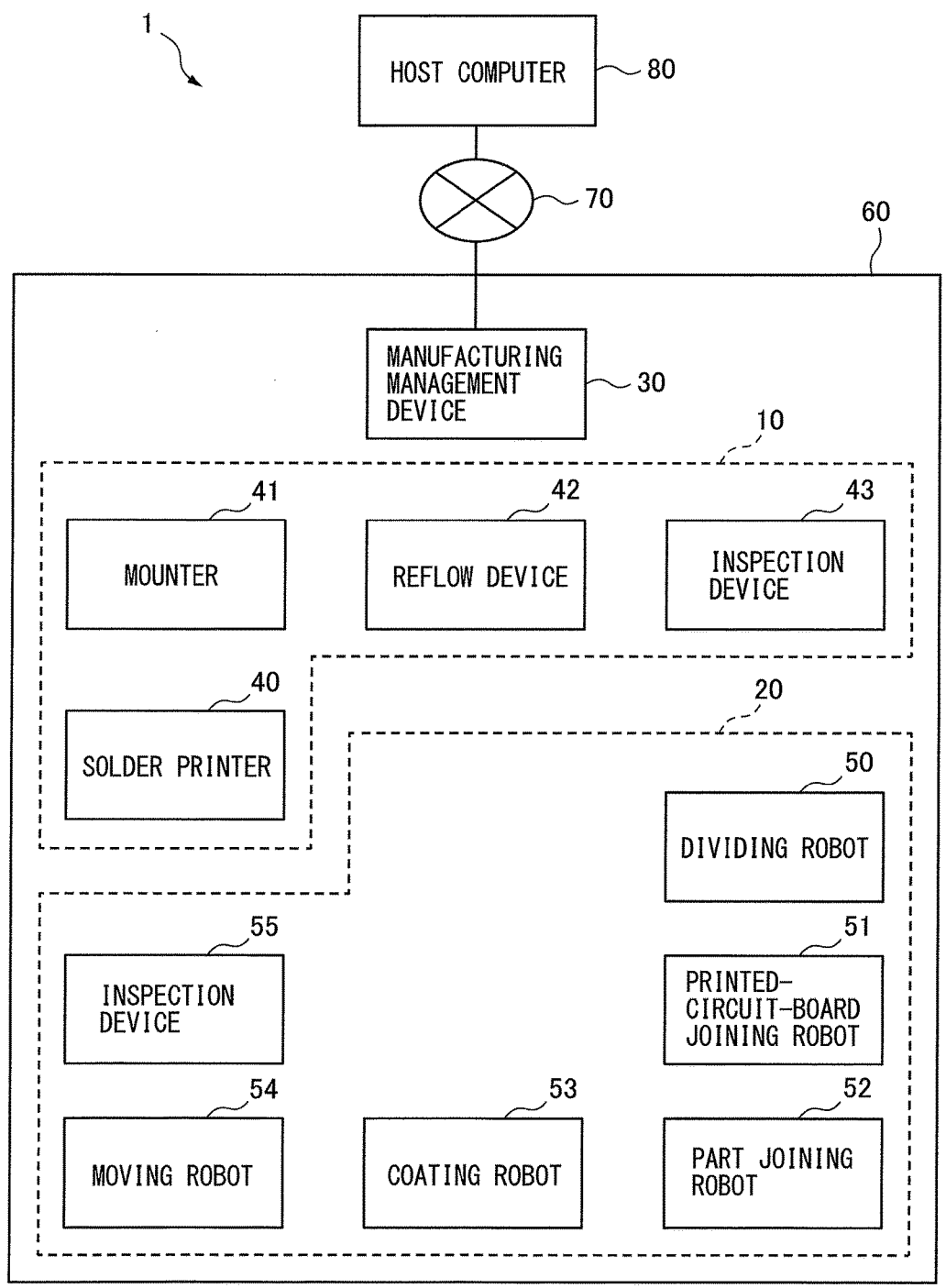
FIG. 1 is a schematic diagram showing an automatic assembling system according to the present invention.

Embodiments of the present invention will be specifically described below with reference to the accompanying drawings. In the drawings, the same constituent elements are indicated by the same reference numerals. The technical scope of the invention described in claims and the definition of terms are not limited by the following description.

First Embodiment

Figure 2:
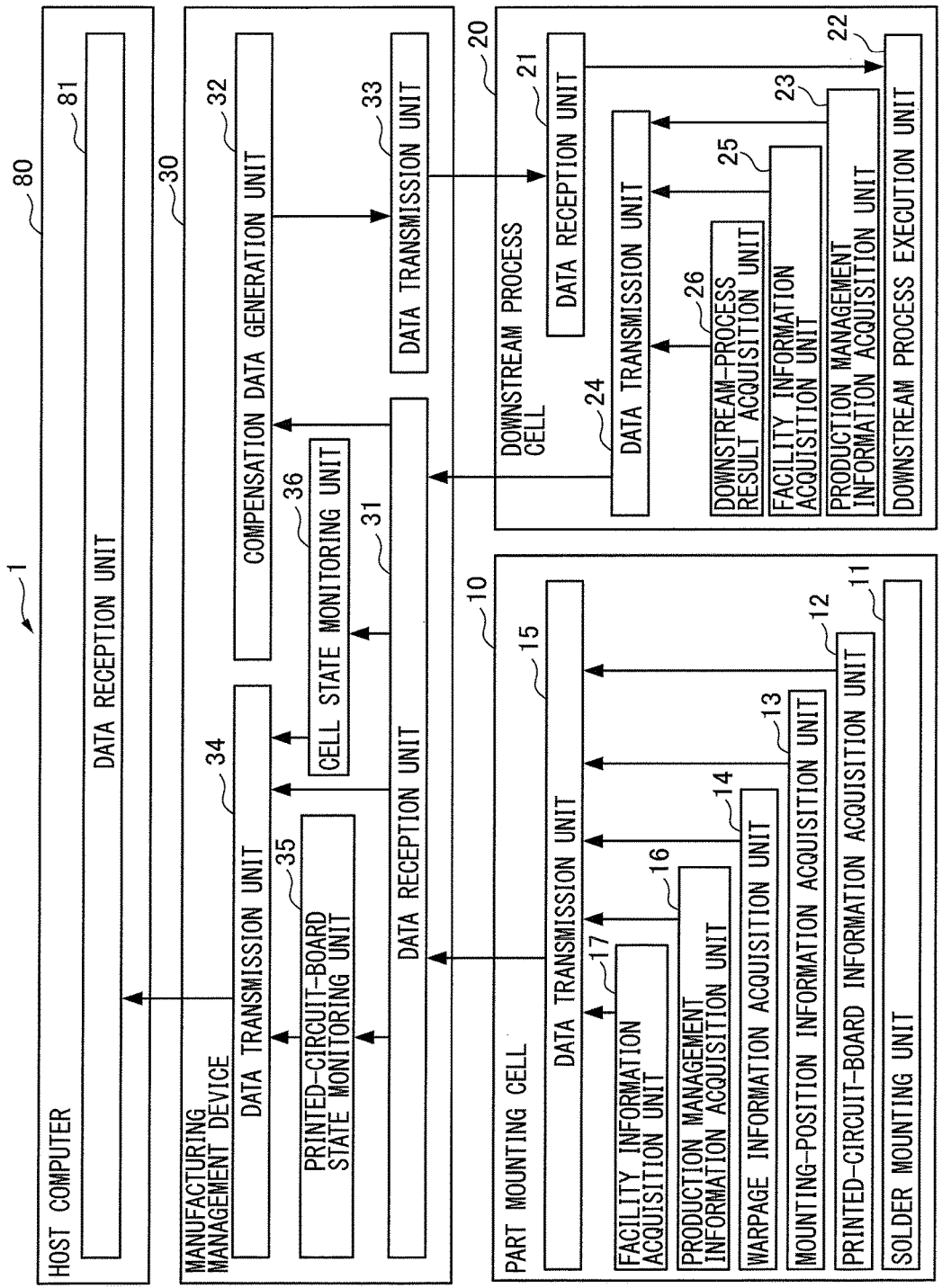
FIG. 2 is a block diagram showing the computer configuration of the automatic assembling system according to the present invention.

Referring to FIGS. 1 and 2, the configuration of an automatic assembling system according to a first embodiment will be described below. FIG. 1 is a schematic diagram of the automatic assembling system. FIG. 2 is a block diagram showing the computer configuration of the automatic assembling system. As shown in FIG. 1, cellular manufacturing enabling low-volume high-variety production is used in an automatic assembling system 1. The automatic assembling system 1 includes a part mounting cell 10 in charge of a mounting process of soldering electronic parts to a printed circuit board, a downstream process cell 20 in charge of a downstream process including a manufacturing process following the mounting process, and a manufacturing management device 30 that manages manufacturing in the part mounting cell 10 and the downstream process cell 20.

The part mounting cell 10 includes a solder printer 40 that prints solder paste on a printed circuit board, a mounter 41 that mounts electronic parts on the printed circuit board, a reflow device 42 that fixes the electronic parts with the molten solder paste printed on the printed circuit board, and an inspection device 43 that inspects the printed circuit board with the mounted parts. In other embodiments, the part mounting cell 10 may include a device constituting a flow process instead of a reflow process.

The downstream process cell 20 includes a dividing robot 50 that divides a printed circuit board into a desired size, a printed-circuit-board joining robot 51 that joins printed circuit boards, a part joining robot 52 that joins other parts to the printed circuit board, a coating robot 53 that applies materials such as a coating material and an adhesive to the printed circuit board, and a moving robot 54 that moves the printed circuit board to a desired location, and an inspection device 55 that inspects the printed circuit board after the downstream process.

As shown in FIG. 2, the inspection device of the part mounting cell 10 further includes an alignment-mark-position information acquisition unit 12 that obtains an image of the printed circuit board with a CCD camera or the like and processes the obtained image to acquire position information on an alignment mark provided at a specific position on the printed circuit board, a mounting-position information acquisition unit 13 that processes the obtained image to acquire mounting position information on an electronic part, and a warpage information acquisition unit 14 that measures, with an infrared laser range finder or the like, a distance from a reflective mark provided at a specific position on the printed circuit board and acquires warpage information on the printed circuit board based on the measured distance. The automatic assembling system according to the first embodiment may be only provided with a printed-circuit-board information acquisition unit including at least one of the alignment-mark-position information acquisition unit 12, the mounting-position information acquisition unit 13, and the warpage information acquisition unit 14.

In the part mounting cell 10, a solder mounting unit 11 including a solder printer mounts electronic parts on a printed circuit board. The alignment-mark-position information acquisition unit 12 then acquires position information on an alignment mark, the mounting-position information acquisition unit 13 acquires mounting position information on an electronic part, and the warpage information acquisition unit 14 acquires warpage information on the printed circuit board. Printed circuit board information including at least one of the acquired position information on the alignment mark, the mounting position information on the electronic part, and the warpage information is transmitted to the manufacturing management device 30 through a data transmission unit 15.

In the manufacturing management device 30, the printed circuit board information transmitted from the part mounting cell 10 is received by a data reception unit 31. Based on the printed circuit board information received by the data reception unit 31, a compensation data generation unit 32 generates compensation data for compensating for a program to be executed in the downstream process cell 20. The generated compensation data is transmitted to the downstream process cell 20 through a data transmission unit 33.

In the downstream process cell 20, the compensation data transmitted from the manufacturing management device 30 is received by a data reception unit 21. Based on the compensation data received by the data reception unit 21, the program of a downstream process execution unit 22 compensates for coordinate information on the printed circuit board and the electronic part and then executes the downstream process. Coordinate information on the program executed in the downstream process cell is compensated so as to improve the yield of the downstream process cell.

Figure 3:
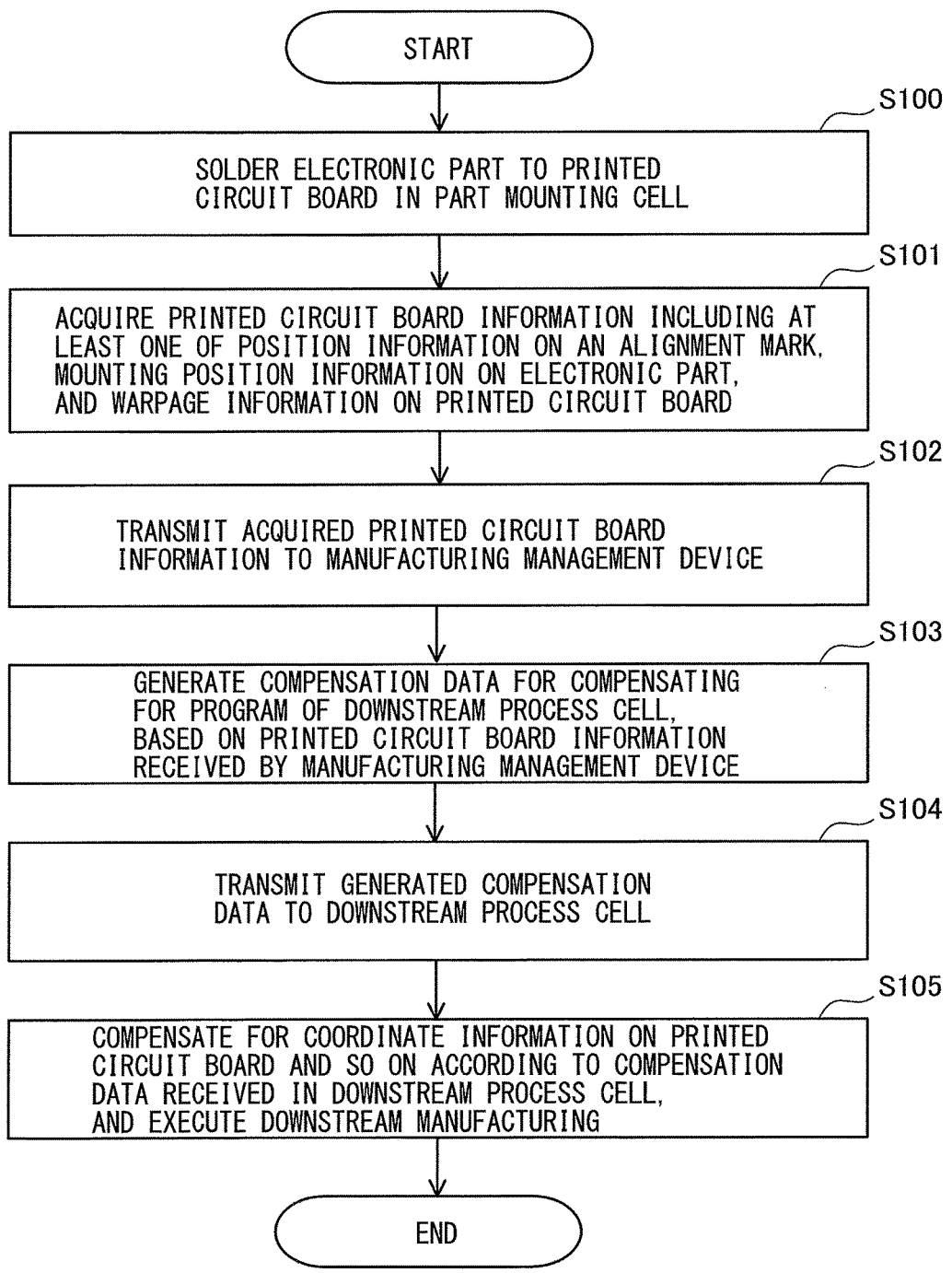
FIG. 3 is a flowchart showing an automatic assembling method according to the present invention.

Referring to FIG. 3, an automatic assembling method according to the first embodiment will be described below. FIG. 3 is a flowchart showing the automatic assembling method. The automatic assembling method of the first embodiment is performed by programs executed by the part mounting cell, the downstream process cell, and the processor of the manufacturing management device that are shown in FIG. 2. First, in step S100, an electronic part is soldered to a printed circuit board in the part mounting cell. In step S101, the printed circuit board information including at least one of the position information on the alignment mark, the mounting position information on the electronic part, and the warpage information on the printed circuit board is acquired in the part mounting cell. In step S102, the printed circuit board information acquired in the part mounting cell is transmitted to the manufacturing management device. In step S103, compensation data for compensating for the program of the downstream process cell is generated based on the printed circuit board information received by the manufacturing management device. In step S104, the compensation data generated by the manufacturing management device is transmitted to the downstream process cell. In step S105, the coordinate information on the printed circuit board and the electronic part is compensated according to the compensation data received by the downstream process cell, and then the downstream process is executed.

Figure 4:
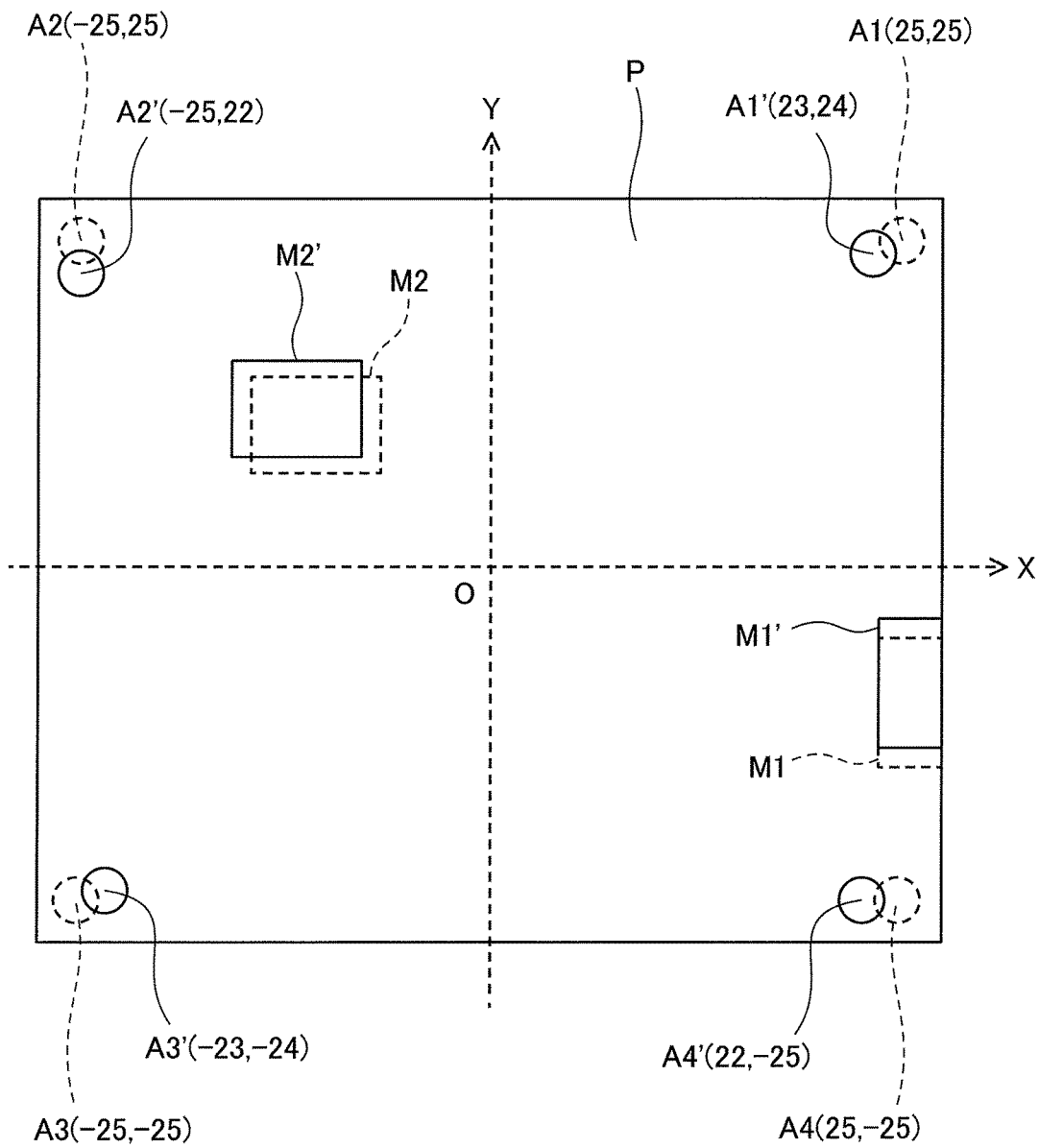
FIG. 4 shows an example of a method of generating compensation data according to the present invention.
Figure 5:
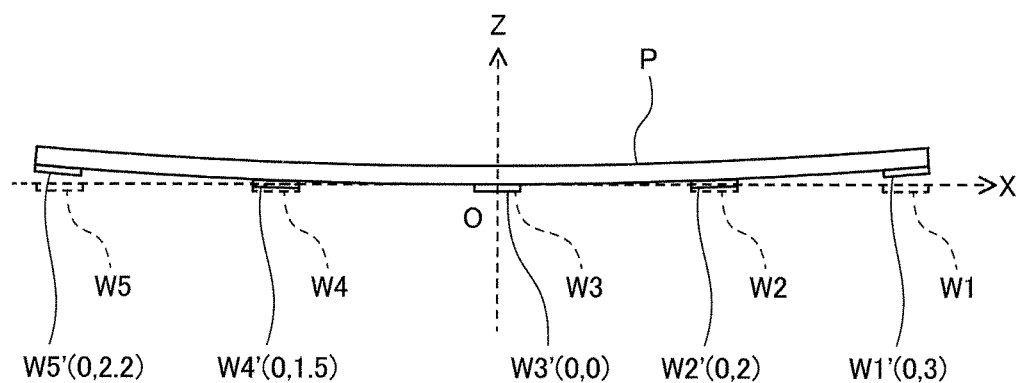
FIG. 5 shows the example of the method of generating the compensation data according to the present invention.

Referring to FIGS. 4 and 5, an example of a method of generating compensation data will be discussed below. FIG. 4 is a plan view of a printed circuit board according to the example of the method of generating the compensation data. FIG. 5 is a cross-sectional view of the printed circuit board according to the example of the method of generating the compensation data. As shown in FIG. 4, the center of a printed circuit board P is denoted as an origin O and alignment marks A1 to A4 on the four corners of the printed circuit board P are displaced to A1' to A4', respectively, after the mounting process (FIG. 4 shows the coordinate values of the alignment marks). In this case, expansion/contraction rates E1 to E4 of the printed circuit board in the first to fourth quadrants are determined as a segment OA1'/segment OA1, a segment OA2'/segment OA2, a segment OA3'/segment OA3, and a segment OA4'/segment OA4. Thus, the printed circuit board P has expansion/contraction rates of E1 (x, y)=(0.92, 0.96), E2 (x, y)=(1, 0.88), E3 (x, y)=(0.92, 0.96), and E4 (x, y)=(0.88, 1) in the first to fourth quadrants in the X direction and the Y direction. The determined rates E1 to E4 indicate compensation data. The program executed in the downstream process cell compensates for the X coordinate and Y coordinate of the printed circuit board according to the compensation data.

As shown in FIG. 4, if mounting positions M1 and M2 of electronic parts are displaced to M1' and M2', respectively, after the mounting process, the X coordinates and the Y coordinates of the displaced electronic parts are used as compensation data as they are. The program executed in the downstream process cell compensates for the X coordinates and Y coordinates of the electronic parts according to the compensation data.

As shown in FIG. 5, the center of the printed circuit board is denoted as the origin O and reflective marks W1 to W5 arranged in the X direction are displaced to W1' to W5', respectively, after the mounting process (FIG. 5 shows the coordinate values of the displaced reflective marks). In this case, an approximate curve of the sectional line of the printed circuit board is determined by the least square method based on the Z coordinates of the displaced W1' to W5'. The determined approximate curve indicates compensation data. The program executed in the downstream process cell compensates for the Z coordinates of the printed circuit board according to the compensation data.

As described above, in the automatic assembling system 1 of the first embodiment, the manufacturing management device 30 generates compensation data for compensating for the program executed in the downstream process cell 20 and performs feedforward control on the manufacturing of the downstream process cell 20 based on the position information on the alignment marks of the printed circuit board (expansion/contraction of the printed circuit board), the mounting position information on electronic parts, and the warpage information on the printed circuit board (the warpage amount of the printed circuit board), the information being acquired in the part mounting cell 10. Thus, the coordinate information on the program executed in the downstream process cell 20 can be compensated so as to improve the yield of the downstream process cell 20.

Second Embodiment

Referring to FIG. 2, an automatic assembling system according to a second embodiment of the present invention will be described below. The same configurations and operations as those of the automatic assembling system according to the first embodiment will not be discussed. In an automatic assembling system 1 according to the second embodiment, a part mounting cell 10 further includes a production management information acquisition unit 16 that acquires production management information (including serial numbers, types, and production lots) allowing identification of printed circuit boards according to the bar codes of the printed circuit boards. A downstream process cell 20 further includes a production management information acquisition unit 23 that acquires production management information allowing identification of printed circuit boards according to the bar codes of the printed circuit boards as in the part mounting cell 10, and a data transmission unit 24 that transmits the acquired production management information to a manufacturing management device 30. The production management information acquired in the production management information acquisition units 16 and 23 is transmitted to the manufacturing management device 30 through a data transmission unit 15 and the data transmission unit 24.

In the manufacturing management device 30, the production management information transmitted from the part mounting cell 10 and the downstream process cell 20 is received by a data reception unit 31. A compensation data generation unit 32 confirms the identification of the production management information received by the data reception unit 31 from the part mounting cell 10 and the downstream process cell 20. This can confirm that printed circuit boards to be targeted in the part mounting cell 10 and the downstream process cell 20 are identical to each other. After confirmation of the identification of the printed circuit boards, the compensation data generation unit 32 generates compensation data based on, for example, position information on alignment marks. The generated compensation data is transmitted to the downstream process cell 20 through a data transmission unit 33.

In the downstream process cell 20, the compensation data transmitted from the manufacturing management device 30 is received by a data reception unit 21. Based on the compensation data received by the data reception unit 21, a downstream process execution unit 22 compensates for coordinate information on the same printed circuit board as in the part mounting cell 10 and then executes a downstream process. If production management information received in the part mounting cell 10 and the downstream process cell 20 is not identical to each other, printed circuit boards to be targeted in the part mounting cell 10 and the downstream process cell 20 are not identical to each other. Thus, the compensation data generation unit 32 generates an alarm instead of compensation data. This can prevent compensation data from being erroneously used for a different printed circuit board.

Third Embodiment

Referring to FIGS. 1 and 2, an automatic assembling system according to a third embodiment of the present invention will be described below. The same configurations and operations as those of the automatic assembling systems according to the first and second embodiments will not be discussed. As shown in FIG. 1, an automatic assembling system 1 according to a third embodiment further includes a host computer 80. The host computer 80 is connected so as to communicate with a manufacturing management device 30 and other manufacturing management devices via a LAN or WAN 70. As shown in FIG. 2, the host computer 80 includes a data reception unit 81 that receives data from the manufacturing management device 30. The manufacturing management device 30 further includes a data transmission unit 34 that transmits data to the host computer 80.

The data transmission unit 34 in the manufacturing management device 30 transmits printed circuit board information including at least one of position information on alignment marks, mounting position information on electronic parts, and warpage information on a printed circuit board, from the part mounting cell 10 to the host computer 80.

In the host computer 80, the printed circuit board information including at least one of the position information on alignment marks, the mounting position information on electronic parts, and the warpage information on a printed circuit board is received by the data reception unit 81 from the manufacturing management device 30. The printed circuit board information received by the data reception unit 81 can be used for adjusting the manufacturing conditions of the part mounting cell 10. Moreover, the printed circuit board information can be used for correcting the manufacturing conditions of a board manufacturer and improving the artwork design of a printed circuit board.

Fourth Embodiment

Referring to FIG. 2, an automatic assembling system according to a fourth embodiment of the present invention will be described below. The same configurations and operations as those of the automatic assembling systems according to the first to third embodiments will not be discussed. In an automatic assembling system 1 of the fourth embodiment, a manufacturing management device 30 further includes a printed-circuit-board state monitoring unit 35 that monitors printed circuit board information including at least one of position information on alignment marks, mounting position information on electronic parts, and warpage information on a printed circuit board. If the printed circuit board information deviates from a specified value, the printed-circuit-board state monitoring unit 35 transmits the printed circuit board information deviating from the specified value, to a host computer 80 through a data transmission unit 34.

In the host computer 80, the printed circuit board information that is received from the manufacturing management device 30 and deviates from the specified value is received by a data reception unit 81. The printed circuit board information that is received in the host computer 80 and deviates from the specific value can be used for adjusting the manufacturing conditions of a part mounting cell 10, correcting the manufacturing conditions of a board manufacturer, and improving the artwork design of a printed circuit board.

Fifth Embodiment

Referring to FIG. 2, an automatic assembling system according to a fifth embodiment of the present invention will be described below. The same configurations and operations as those of the automatic assembling systems according to the first to fourth embodiments will not be discussed. In an automatic assembling system 1 of the fifth embodiment, a part mounting cell 10 further includes a facility information acquisition unit 17 that acquires facility information including the manufacturing conditions of a device constituting a soldering mounting unit 11. The facility information includes, for example, squeegee printing pressure information on solder printers, squeegee attack angle information, coordinate information on nozzles and backup jigs in a mounter, reflow temperature profile information on reflow devices, and reflow preventing chain information. The facility information acquired by the facility information acquisition unit 17 is transmitted to the host computer 80 through the manufacturing management device 30.

In other embodiments, only if the printed circuit board information deviates from a specified value, the facility information acquired by the facility information acquisition unit 17 may be transmitted to the host computer 80 through the manufacturing management device 30, the printed circuit board information including at least one of position information on alignment marks monitored by the printed-circuit-board state monitoring unit 35, mounting position information on electronic parts, and warpage information on a printed circuit board.

The facility information received by the host computer 80 can be used for the adjustment of the manufacturing conditions of the part mounting cell 10 and the maintenance of the part mounting cell 10.

Sixth Embodiment

Referring to FIG. 2, an automatic assembling system according to a sixth embodiment of the present invention will be described below. The same configurations and operations as those of the automatic assembling systems according to the first to fifth embodiments will not be discussed. In an automatic assembling system 1 of the sixth embodiment, a downstream process cell 20 further includes a facility information acquisition unit 25 that acquires facility information including the manufacturing conditions of a device constituting a downstream process execution unit 22. A manufacturing management device 30 further includes a cell state monitoring unit 36 that monitors the facility states of a part mounting cell 10 and the downstream process cell 20. The facility information includes, for example, coordinate information on robot arms, pressure information on pressure sensors provided for robots, and the speed of a servo motor for driving the robots. The facility information acquired by the facility information acquisition unit 25 is transmitted to the manufacturing management device 30 through a data transmission unit 24.

In the manufacturing management device 30, the facility information transmitted from the part mounting cell 10 and the downstream process cell 20 is received by a data reception unit 31. If the printed circuit board information including at least one of position information on alignment marks, mounting position information on electronic parts, and warpage information on a printed circuit board deviates from a specified value, the facility information received from the part mounting cell 10 and the downstream process cell 20 is transmitted by the cell state monitoring unit 36 to a host computer 80 along with the printed circuit board information deviating from the specified value.

In the host computer 80, a data reception unit 81 receives the printed circuit board information that is received from the manufacturing management device 30 and deviates from the specified value and the facility information of the part mounting cell 10 and the downstream process cell 20. The printed circuit board information that is received in the host computer 80 and deviates from the specific value and the facility information of the part mounting cell 10 and the downstream process cell 20 can be used for the adjustment of the device manufacturing conditions of the part mounting cell 10 and the downstream process cell 20 and maintenance of the cells.

Seventh Embodiment

Referring to FIG. 2, an automatic assembling system according to a seventh embodiment of the present invention will be described below. The same configurations and operations as those of the automatic assembling systems according to the first to sixth embodiments will not be discussed. In an automatic assembling system 1 of the seventh embodiment, a downstream process cell 20 further includes a downstream-process result acquisition unit 26 that acquires downstream process results including position information on other parts joined to a printed circuit board. The downstream process results acquired by the downstream-process result acquisition unit 26 are transmitted to a host computer 80 through a manufacturing management device 30.

The downstream process results received by the host computer 80 can be used for examining correlation with the printed circuit board information including at least one of position information on alignment marks, mounting position information on electronic parts, and warpage information on a printed circuit board, the printed circuit board information being acquired in a part mounting cell 10. This allows feedback to the manufacturing conditions of the part mounting cell 10 in consideration of the examination result.

Eighth Embodiment

Referring to FIG. 2, an automatic assembling system according to an eighth embodiment of the present invention will be described below. The same configurations and operations as those of the automatic assembling systems according to the first to seventh embodiments will not be discussed. In the automatic assembling system 1 of the eighth embodiment, a downstream process cell 20 transmits a downstream process result acquired by a downstream-process result acquisition unit 26 to a manufacturing management device 30. A compensation data generation unit 32 of the manufacturing management device 30 generates compensation data based on the downstream process result in addition to printed circuit board information including at least one of position information on alignment marks, mounting position information on electronic parts, and warpage information on a printed circuit board.

In addition to the printed circuit board information including the position information on alignment marks, the compensation data is generated in consideration of the downstream process result and thus can have higher accuracy than in the absence of the downstream process result.

The operation and effect of the present invention will be described below. The compensation data is generated based on the printed circuit board information including at least one of the position information on alignment marks, the mounting position information on electronic parts, and the warpage information on a printed circuit board, the printed circuit board information being acquired in a part mounting cell 10. This can compensate for coordinate information on the program executed by the downstream process cell 20, thereby improving the yield of the downstream process cell 20.

The provided programs of the foregoing embodiments may be recorded on non-transitory computer-readable recording media, for example, CD-ROMs.

The present invention is not limited by the embodiments described in the specification. It should be understood that various changes can be made within the scope of claims.

The invention claimed is:

1. An automatic assembling system comprising at least one part mounting cell in charge of a mounting process of soldering an electronic part to a printed circuit board, at least one downstream process cell in charge of a downstream process including a manufacturing process following the mounting process, and at least one manufacturing management device that receives data from the part mounting cell, transmits the data to the downstream process cell, and manages manufacturing,
wherein the part mounting cell includes a solder mounting unit that solders the electronic part to the printed circuit board, a printed-circuit-board information acquisition unit that acquires printed circuit board information including position information on an alignment mark disposed at a specific position on the printed circuit board so as to facilitate position arrangement of the printed circuit board, mounting position information on the electronic part on the printed circuit board, and warpage information on the printed circuit board, and a data transmission unit that transmits the acquired printed circuit board information to the manufacturing management device,
the manufacturing management device includes a data reception unit that receives the printed circuit board information from the part mounting cell, a compensation data generation unit that compensates for, based on the printed circuit board information, three dimensional coordinate information on the printed circuit board and the electronic part on a program to be executed in the downstream process cell, and a data transmission unit that transmits the compensation data to the downstream process cell,
the downstream process cell includes a data reception unit that receives the compensation data from the manufacturing management device and a downstream process execution unit that executes the downstream process based on the compensation data generated by the compensation data generation unit, and
the downstream process execution unit includes at least one robot of a robot that divides the printed circuit board into a desired size, a robot that joins printed circuit boards, a robot that applies a coating material or an adhesive to the printed circuit board, and a robot that moves the printed circuit board to a desired location.

2. The automatic assembling system according to claim 1, wherein the part mounting cell further includes a production management information acquisition unit that acquires production management information allowing identification of the printed circuit board and transmits the acquired production management information with the printed circuit board information to the manufacturing management device,
the downstream process cell further includes a production management information acquisition unit that acquires production management information allowing identification of the printed circuit board, and a data transmission unit that transmits the production management information to the manufacturing management device, and
the manufacturing management device confirms that the printed circuit boards to be targeted in the part mounting cell and the downstream process cell are identical to each other based on the production management information received from the part mounting cell and the downstream process cell, and transmits the compensation data generated by the compensation data generation unit to the downstream process cell.

3. The automatic assembling system according to claim 1, further comprising a host computer including a data reception unit that receives data from the manufacturing management device, the manufacturing management device further including a data transmission unit that transmits data to the host computer.

4. The automatic assembling system according to claim 3, wherein the manufacturing management device further includes a printed-circuit-board state monitoring unit that monitors the printed circuit board information, and if the printed circuit board information deviates from a specified value, the printed-circuit-board state monitoring unit transmits the printed circuit board information deviating from the specified value to the host computer.

5. The automatic assembling system according to claim 3, wherein the part mounting cell further includes a facility information acquisition unit that acquires facility information including manufacturing conditions of a device constituting the solder mounting unit, and the acquired facility information is transmitted with the printed circuit board information to the host computer through the manufacturing management device.

6. The automatic assembling system according to claim 5, wherein the downstream process cell further includes a facility information acquisition unit that acquires facility information including manufacturing conditions of a device constituting the downstream process execution unit, the manufacturing management device further includes a cell state monitoring unit that monitors facility states of the part mounting cell and the downstream process cell, and if the printed circuit board information deviates from a specified value, the cell state monitoring unit transmits the facility information acquired in the part mounting cell and the downstream process cell to the host computer along with the printed circuit board information deviating from the specified value.

7. The automatic assembling system according to claim 6, wherein the downstream process cell further includes a downstream-process result acquisition unit that acquires a downstream process result including position information on other parts joined to the printed circuit board, and the acquired downstream process result is transmitted to the host computer through the manufacturing management device.

8. The automatic assembling system according to claim 7, wherein the compensation data generation unit generates compensation data based on the downstream process result in addition to the printed circuit board information.

9. An automatic assembling method performed by an automatic assembling system comprising at least one part mounting cell in charge of a mounting process of soldering an electronic part to a printed circuit board, at least one downstream process cell in charge of a downstream process including a manufacturing process following the mounting process, and at least one manufacturing management device that receives data from the part mounting cell, transmits the data to the downstream process cell, and manages manufacturing, the method comprising the steps of:

soldering the electronic part to the printed circuit board in the part mounting cell;

acquiring printed circuit board information including position information on an alignment mark disposed at a specific position on the printed circuit board so as to facilitate position arrangement of the printed circuit board, mounting position information on the electronic part on the printed circuit board, and warpage information on the printed circuit board;

transmitting the acquired printed circuit board information to the manufacturing management device;

generating compensation data for compensating for three dimensional coordinate information on the printed circuit board and the electronic part on a program to be executed in the downstream process cell, based on the printed circuit board information received by the manufacturing management device;

transmitting the generated compensation data to the downstream process cell; and causing at least one robot of a robot that divides the printed circuit board into a desired size, a robot that joins printed circuit boards, a robot that applies a coating material or an adhesive to the printed circuit board, and a robot that moves the printed circuit board to a desired location to execute the downstream process according to the compensation data received by the downstream process cell.

\* \* \* \* \*